(12) United States Patent
Gluschenkov et al.

(10) Patent No.: US 10,529,828 B2
(45) Date of Patent: Jan. 7, 2020

(54) METHOD OF FORMING VERTICAL TRANSISTOR HAVING DUAL BOTTOM SPACERS

(71) Applicant: INTERNATIONAL BUSINESS MACHINES CORPORATION, Armonk, NY (US)

(72) Inventors: Oleg Gluschenkov, Tannersville, NY (US); Sanjay C. Mehta, Niskayuna, NY (US); Shogo Mochizuki, Clifton Park, NY (US); Alexander Reznicek, Troy, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/249,481

(22) Filed: Jan. 16, 2019

(65) Prior Publication Data
US 2019/0172928 A1 Jun. 6, 2019

Related U.S. Application Data

(63) Continuation of application No. 15/897,706, filed on Feb. 15, 2018, now Pat. No. 10,236,360, which is a continuation of application No. 15/235,829, filed on Aug. 12, 2016, now Pat. No. 9,941,391.

(51) Int. Cl.
H01L 21/311 (2006.01)
H01L 29/66 (2006.01)
H01L 29/08 (2006.01)

(52) U.S. Cl.
CPC .. *H01L 29/66666* (2013.01); *H01L 21/31111* (2013.01); *H01L 29/6653* (2013.01); *H01L 29/6656* (2013.01); *H01L 29/66795* (2013.01); *H01L 29/0847* (2013.01)

(58) Field of Classification Search
CPC ......... H01L 29/66666; H01L 21/31111; H01L 29/6653; H01L 29/66795; H01L 29/6656
See application file for complete search history.

(56) References Cited

U.S. PATENT DOCUMENTS

| 5,087,581 | A | 2/1992 | Rodder |
| 7,323,377 | B1 | 1/2008 | Sedigh et al. |
| 7,683,428 | B2 | 3/2010 | Chidambarrao et al. |
| 7,892,956 | B2 | 2/2011 | Deligianni et al. |
| 8,915,129 | B2 | 12/2014 | Chebli et al. |
| 9,190,466 | B2 | 11/2015 | Basker et al. |
| 9,299,835 | B1 | 3/2016 | Anderson et al. |
| 9,520,392 | B1 * | 12/2016 | Cheng ................. H01L 27/0629 |

(Continued)

OTHER PUBLICATIONS

List of IBM Patents or Patent Applications Treated as Related; (Appendix P), Filed Jan. 17, 2019, 2 pages.

(Continued)

*Primary Examiner* — Selim U Ahmed
(74) *Attorney, Agent, or Firm* — Cantor Colburn LLP; Vazken Alexanian

(57) ABSTRACT

A method of forming a spacer for a vertical transistor is provided. The method includes forming a fin structure on a substrate, depositing a first spacer on exposed surfaces of the substrate to define gaps between the first spacer and the fin structure and depositing a second spacer on the exposed surfaces of the substrate in at least the gaps.

20 Claims, 6 Drawing Sheets

(56) References Cited

U.S. PATENT DOCUMENTS

| | | |
|---|---|---|
| 9,530,700 B1 * | 12/2016 | Mallela .............. H01L 27/0924 |
| 9,941,391 B2 * | 4/2018 | Gluschenkov .... H01L 29/66666 |
| 2006/0118876 A1 | 6/2006 | Lee et al. |
| 2015/0318288 A1 | 11/2015 | Lim et al. |
| 2017/0154883 A1 | 6/2017 | Cheng et al. |
| 2018/0047828 A1 | 2/2018 | Gluschenkov et al. |
| 2018/0190794 A1 | 7/2018 | Gluschenkov et al. |

OTHER PUBLICATIONS

E. Memišević et al., "Thin electron beam defined hydrogen silsesquioxane spacers for vertical nanowire transistors," Journal of Vacuum Science & Technology B, vol. 32, No. 5, 2014, May 12, 2011, 6 pages.

V. D. Kunz et al., "Reduction of parasitic capacitance in vertical MOSFETs by spacer local oxidation," IEEE Transactions on Electron Devices, vol. 50, No. 6, 2003, pp. 1487-1493.

H. V. Mallela et al., "Vertical Field Effect Transistors With Metallic Source/Drain Regions," U.S. Appl. No. 15/140,763, filed Apr. 28, 2016, 68 pages.

K. Cheng et al., "Fabrication of Vertical Field Effect Transistor Structure With Controlled Gate Length," U.S. Appl. No. 15/087,074, filed Mar. 31, 2016, 50 pages.

* cited by examiner

METHOD OF FORMING VERTICAL TRANSISTOR HAVING DUAL BOTTOM SPACERS

DOMESTIC PRIORITY

This application is a continuation of U.S. application Ser. No. 15/897,706, titled "METHOD OF FORMING VERTICAL TRANSISTOR HAVING DUAL BOTTOM SPACERS", filed Feb. 15, 2018 and which is a continuation of U.S. application Ser. No. 15/235,829, titled "METHOD OF FORMING VERTICAL TRANSISTOR HAVING DUAL BOTTOM SPACERS", filed Aug. 12, 2016, has now issued as U.S. Pat. No. 9,941,391, the contents of which are incorporated herein by reference herein by its entirety.

BACKGROUND

The present invention relates to semiconductor devices, and more specifically, to fabrication methods and resulting structures for a vertical transistor having dual bottom spacers.

As demands to reduce the dimensions of transistor devices continue, new designs and fabrication techniques to achieve a reduced device footprint are developed. Vertical-type transistors such as vertical field effect transistors (vertical FETs) have recently been developed to achieve a reduced FET device footprint without comprising necessary FET device performance characteristics. When forming these vertical FETS, spacers need to be provided between and around vertical structures.

The formation of such spacers can be problematic, however, especially in the case of bottom spacers that run along upper substrate surfaces. Indeed, bottom spacer formation often requires that a directional deposition process be executed and, while directional deposition processing is possible, this type of processing often requires additional treatments aimed at removing deposited materials from fin sidewalls. In other cases, directional deposition processing leads to loading effects that can be problematic for tight-pitch structures in aggressively scaled devices.

SUMMARY

According to a non-limiting embodiment of the present invention, a method of forming a spacer for a vertical transistor is provided. The method includes forming a fin structure on a substrate, depositing a first spacer on exposed surfaces of the substrate to define gaps between the first spacer and the fin structure and depositing a second spacer on the exposed surfaces of the substrate in at least the gaps.

According to another non-limiting embodiment, a method of forming a spacer for a vertical transistor is provided and includes forming a fin structure on a substrate, depositing a first spacer and an oxide on the fin structure and on exposed surfaces of the substrate such that uppermost portions of the first spacer are exposed through openings in the oxide, etching portions of the first spacer adjacent to the fin structure via the openings to define gaps between remainders of the first spacer and the fin structure and depositing a second spacer on re-exposed surfaces of the substrate in at least the gaps.

According to yet another non-limiting embodiment, a method of forming a spacer for a vertical transistor is provided and includes forming multiple fin structures on a semiconductor substrate, depositing a first spacer and an oxide on each of the multiple fin structures and on exposed surfaces of the semiconductor substrate between and around the multiple fin structures such that uppermost portions of the first spacer are exposed through openings in the oxide, etching portions of the first spacer adjacent to each of the multiple fin structures via the openings to define gaps between remainders of the first spacer and corresponding ones of each of the multiple fin structures and depositing a second spacer on re-exposed surfaces of the semiconductor substrate in at least the gaps.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1-15 are a series of views illustrating a method of forming a vertical FET device according to exemplary embodiments of the present teachings, in which:

FIG. 1 is a side view of a semiconductor substrate with fin structures formed thereon;

FIG. 2 is a side view of a semiconductor substrate and fin structures with a first spacer formed on sidewalls of the fin structures and exposed upper surfaces of the semiconductor substrate;

FIG. 3 is a side view of a thick oxide deposition over the first spacer of FIG. 2;

FIG. 4 is a side view of the oxide deposition having been thinned following chemical mechanical processing of the thick oxide deposition of FIG. 3;

FIG. 5 is a side view of a structure resulting from isotropic etching of the oxide deposition near the fin structures;

FIG. 6 is a side view of a structure resulting from further, un-isotropic etching of the oxide deposition near the fin structures;

FIG. 7 is an enlarged view of a gap formed in a bottom spacer due to the un-isotropic etching of FIG. 6;

FIG. 8 is a side view of a semiconductor substrate and remainders of a first spacer following the un-isotropic etching of FIGS. 6 and 7;

FIG. 9 is a side view of a second spacer deposited in gaps between the remainders of a first spacer and fin structures;

FIG. 10 is a side view of a thick second spacer deposition over the remainders of the first spacer and the initial second spacer deposition;

FIG. 11 is an enlarged side view of the second spacer having been deposited as shown in FIGS. 9 and 10;

FIG. 12 is a side view of a structure resulting from isotropic etching of the second spacer of FIGS. 9-12.

FIG. 13 is an enlarged side view of second spacer fillets remaining following the isotropic etching of the second spacer;

FIG. 14 is a side view of a gate stack built over the first and second spacers and around fins;

FIG. 15 is a side view of first and second spacers built over a gate stack using similar processes as those of FIGS. 2-13.

DETAILED DESCRIPTION

Figure 1:
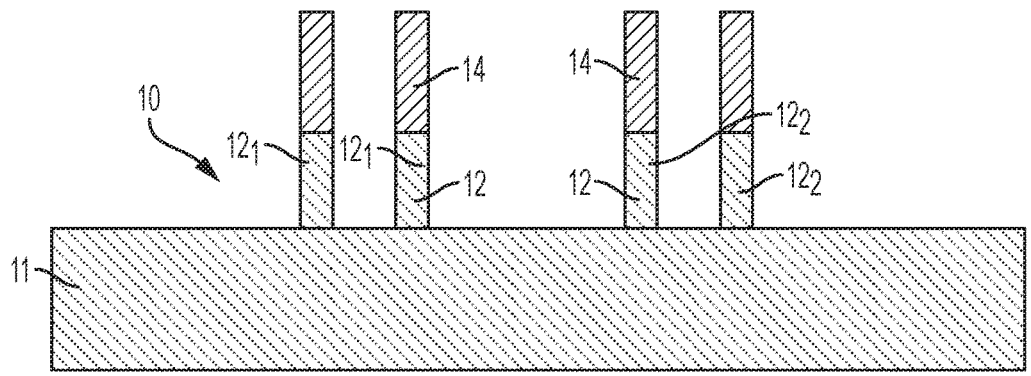

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of the present invention, one or more embodiments provide a vertical-type semiconductor structure (e.g., a vertical FET or VFET) and include dual bottom spacers that are formed by deposition and sequences of un-isotropic etching processes.

Turning now to a more detailed description of the present invention, with reference to FIG. 1, a semiconductor structure 10 for fabrication of a vertical-type semiconductor device such as a vertical FET or VFET, for example, is illustrated according to a non-limiting embodiment. The semiconductor structure 10 generally extends along a plane and includes a semiconductor substrate 11, fins 12 and hard masks 14 for each of the fins 12. The semiconductor substrate 11 can be provided as a bulk semiconductor substrate or as a semiconductor-on-insulator (SOI) substrate as understood by one of ordinary skill in the art. In at least one embodiment, the material of the semiconductor substrate 11 can be silicon (Si) though other semiconductor substrate materials are possible.

The fins 12 can be provided in groups of fins 12. For example, as shown in FIG. 1, the fins 12 can be provided as a first group of proximal fins $12_1$ and as a second group of proximal fins $12_2$. This formation is of course exemplary and not intended to limit the description in any way.

The fins 12 extend vertically upwardly from an uppermost surface layer of the semiconductor substrate 11 and can be formed of similar or different materials as the semiconductor substrate 11. The hard masks 14 are provided on the uppermost surface layers of the fins 12 and can be formed of any hard mask material that would be appropriate for patterning the fins 12. In accordance with embodiments, the hard masks 14 can be formed of materials that have a higher etching resistance than silicon nitride (SiN) for example (e.g., SiOCN, SiOC, SiC, SiBCN, SiCN, etc.).

Figure 2:
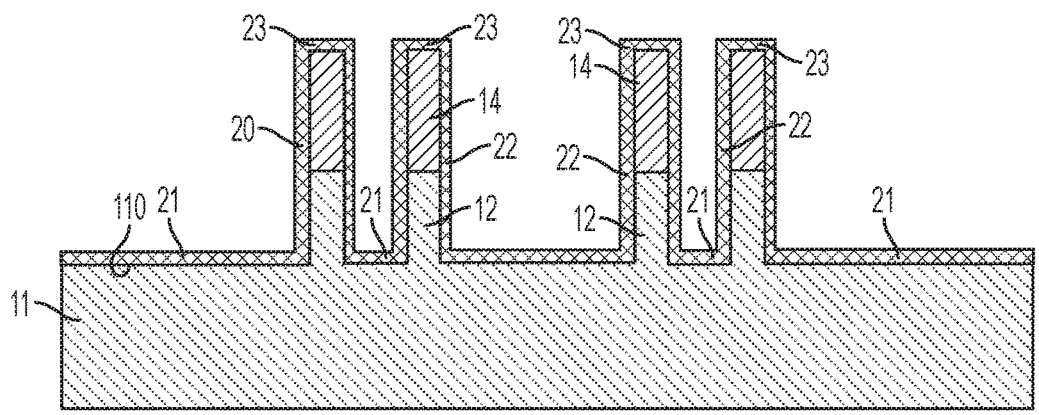

With reference to FIG. 2, a first spacer 20 can be formed on sidewalls of the fins 12 and upper surfaces 110 of the semiconductor substrate 11 that are exposed around and between the fins 12. The first spacer 20 can include silicon nitride (SiN) or another similar material and the formation of the first spacer 20 can be achieved by conformal deposition, such as atomic layer deposition (ALD) or another similar depositional process, and an optional post depositional etch process. The first spacer 20 can thus include bottom spacer portions 21 that run along the upper surfaces 110, sidewall spacer portions 22 that run along sidewalls of the fins 12 and the hard masks 14 and uppermost spacer portions 23 that run along uppermost surfaces of the hard masks 14.

Figure 3:
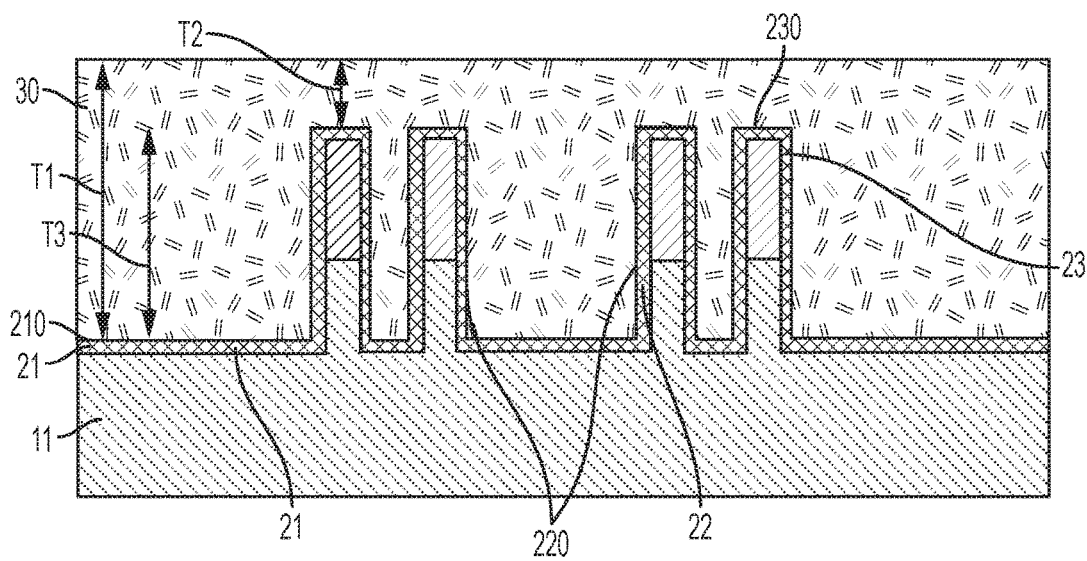

With reference to FIG. 3, once the first spacer 20 formation is complete, a thick oxide layer 30 is deposited over upper surfaces 210 of the bottom spacer portions 21, exterior surfaces 220 of the sidewall spacer portions 22 and upper surfaces 230 of the uppermost spacer portions 23. The thick oxide layer 30 extends over the upper surfaces 230 of the uppermost spacer portions 23 and thus can have a first thickness T1 at locations remote from the fins 12 and a second thickness T2 at locations over and above the fins 12. In accordance with embodiments, the first thickness T1 can be substantially thicker than the second thickness T2 such that a difference between T1 and T2 is a third thickness T3.

The oxide layer 30 can be formed of silicon oxide (SiO2) or another similar oxide material.

Figure 4:
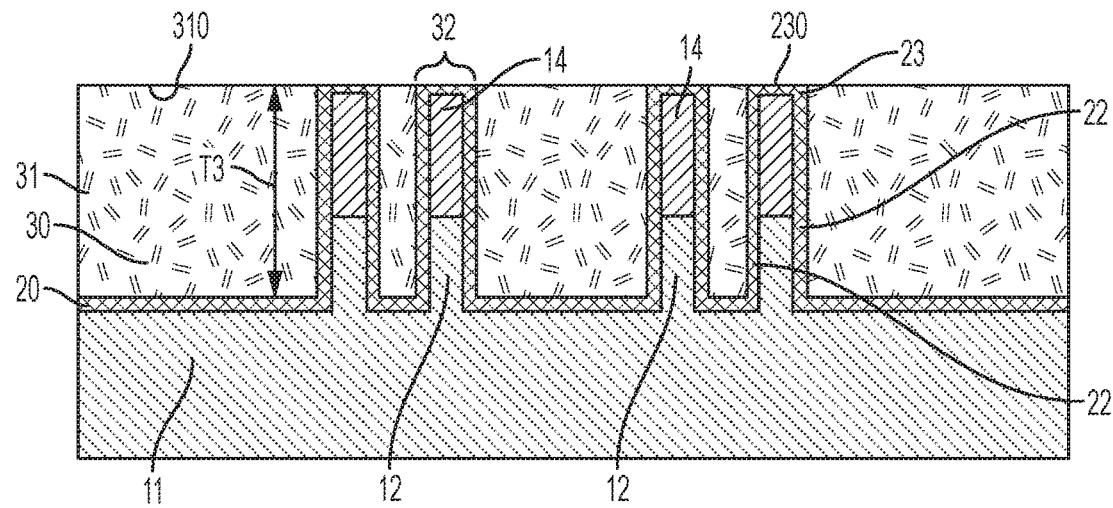

With reference to FIG. 4, an upper section of the oxide layer 30 is removed to expose the upper surfaces 230 of the uppermost spacer portions 23. In particular, chemical mechanical polishing (CMP) or another similar process can be executed to remove the upper section of the oxide layer 30 such that the resulting thinned oxide layer 31 has a planarized upper surface 310 which is substantially flat and coplanar with the upper surfaces 230. The thinned oxide layer 31 is thus formed to define oxide layer openings 32 at and around the fins 12, the hard masks 14, the sidewall spacer portions 22 and the uppermost spacer portions 23.

In accordance with embodiments and, as shown in FIG. 4, the processes used to remove the upper section of the oxide layer 30 to thus form the thinned oxide layer 31 can be halted once the thinned oxide layer 31 has the planarized upper surface 310 which is substantially flat and coplanar with the upper surfaces 230. That is, the removed upper section would have a thickness substantially similar to the third thickness T3. However, it is to be understood that this is not required and that embodiments exist in which the processes are halted prior to such planarization or subsequent to planarization. In the latter case, in particular, the resulting thinned oxide layer would actually have an upper surface that lies below a plane of the upper surfaces 230 and possibly below the uppermost surfaces of the hard masks 14.

Figure 5:
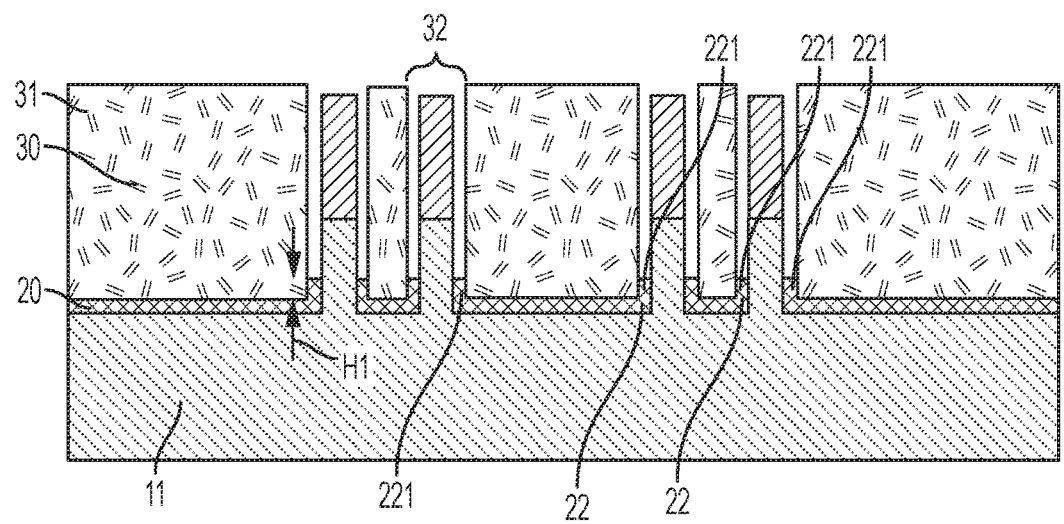

With reference to FIG. 5, isotropic (i.e., multi-directional) etching of the sidewall spacer portions 22 and the uppermost spacer portions 23 is conducted via the oxide layer openings 32. The isotropic etching makes us of etchants that are selective to the materials of the thinned oxide layer 31, the hard masks 14 and the fins 12. In accordance with embodiments, the isotropic etching can be conducted in two stages with the first stage including a frontier selective silicon nitride (SiN) etch process and the second stage including a hot phosphorous etch which is selective to the material of the thinned oxide layer 31. In any case, a result of the isotropic etching is that the uppermost spacer portions 23 are completely removed and all but lower portions 221 of the sidewall spacer portions 22 are removed. The lower portions 221 can extend slightly above the upper surfaces 210 of the bottom spacer portions 21 by a predefined height H1.

Figure 6:
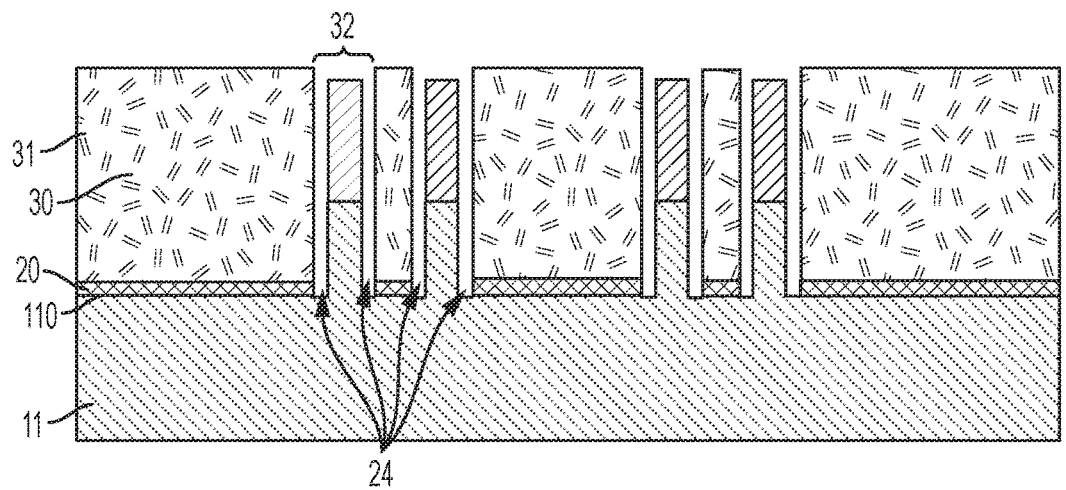
Figure 7:
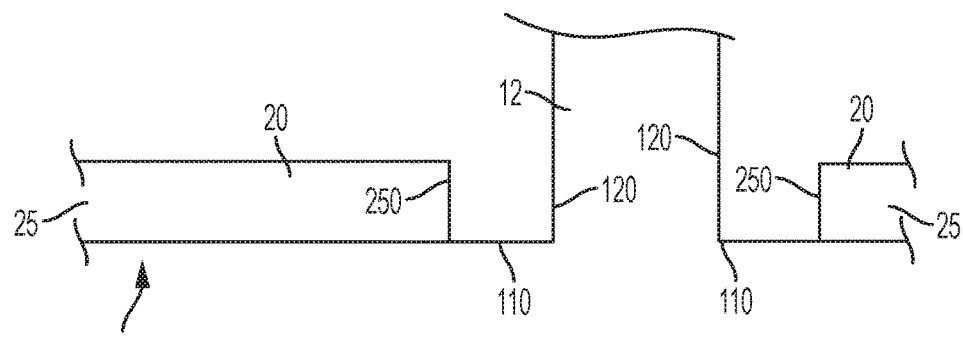

With reference to FIGS. 6 and 7, upon completion of the isotropic etching and the formation of the lower portions 221, un-isotropic (i.e., uni-directional) etching is performed to complete the removal of the sidewall spacer portions 22. The un-isotropic etching can include, for example, reactive ion etching (ME) or other similar dry etching processes. In any case, the un-isotropic etching is halted at the upper surfaces 110 of the semiconductor substrate 11 that are re-exposed as a result of the un-isotropic etching through the oxide layer openings 32 and newly formed gaps 24. As shown in FIG. 7, the gaps 24 are delimited by exterior sidewalls 250 of bottom spacer remainders 25, sidewalls 120 of the bases of the fins 12 and the proximal portions of the upper surfaces 110.

Figure 8:
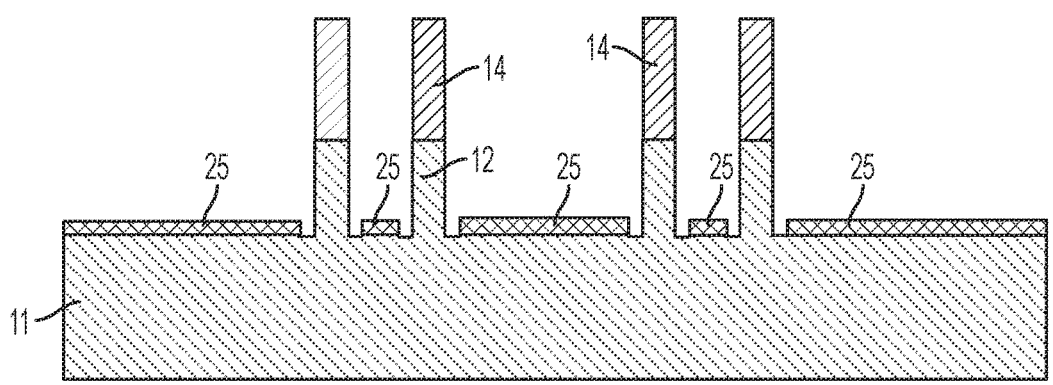

With reference to FIG. 8, the thinned oxide layer 31 is removed by an appropriate etching or machining process to reveal the bottom spacer remainders 25. In accordance with embodiments, the thinned oxide layer 31 is removed by exposure to hydrofluoric acid (HF) or another similar etchant which is selective to the materials of the bottom spacer remainders 25, the fins 12 and the hard masks 14.

Figure 9:
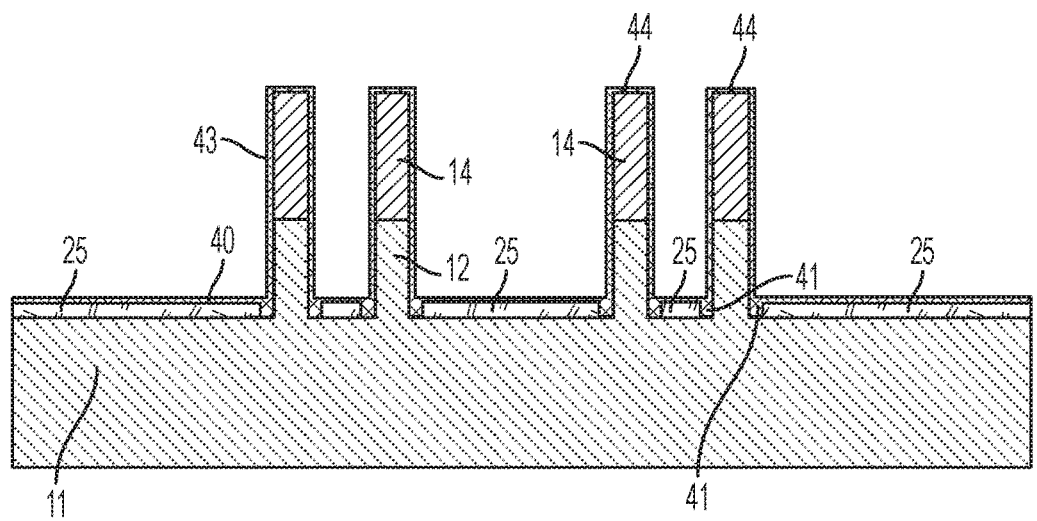
Figure 10:
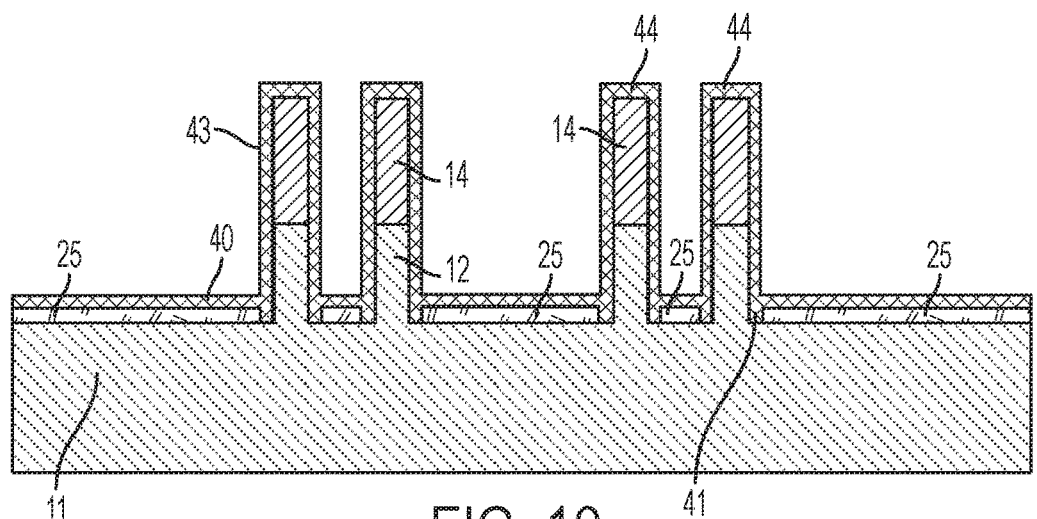
Figure 11:
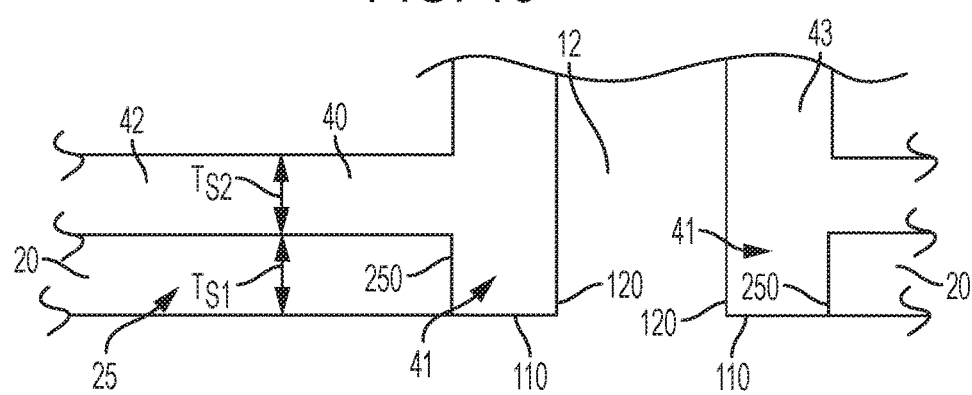

With reference to FIGS. 9-11 and, in accordance with embodiments, a second spacer 40 is formed by a first conformal deposition of second spacer material (e.g., thin ALD processing) as shown in FIG. 9 and by a second conformal deposition of second spacer material (e.g., thick ALD processing) as shown in FIGS. 10 and 11. The second spacer material can include silicon oxide (SiO$_2$), silicon nitride (SiN) or another similar material and can be similar or distinct from the material of the first spacer 20. While the first and second conformal depositions are described herein and illustrated in FIG. 9 and in FIGS. 10 and 11, it is to be understood that other sequences are possible for forming the second spacer 40. For example, a single conformal deposition can be conducted or more than two stages of conformal deposition can be conducted.

In any case, the second spacer 40 includes gap filler portions 41, second bottom spacer portions 42, second sidewall portions 43 and second uppermost portions 44. The gap filler portions 41 fill substantial entireties of the space within the gaps 24 and the second bottom spacer portions 42, the second sidewall portions 43 and the second uppermost portions 44 are disposed similarly as the corresponding portions of the first spacer 20. In accordance with embodiments and, as shown in FIG. 11, a thickness $T_{S2}$ of the second spacer 40 following the conformal deposition(s) can be but is not required to be substantially similar to the thickness $T_{S1}$ of the bottom spacer remainders 25 at least at or above the bottom spacer remainders 25.

Figure 12:
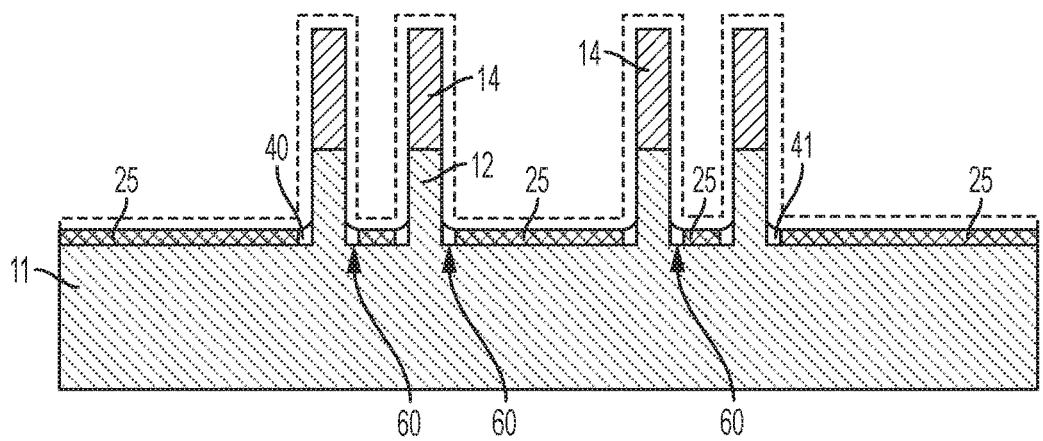
Figure 13:
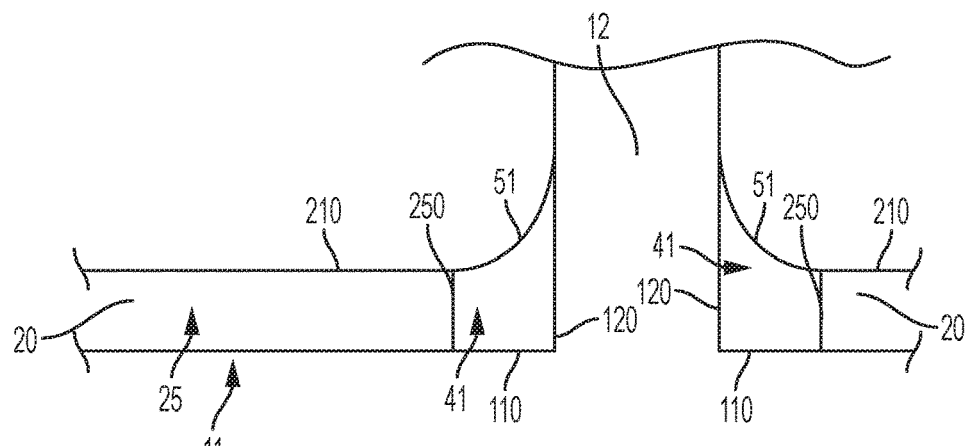

With reference to FIGS. 12 and 13, the second uppermost portions 44 and most of the second bottom spacer portions 42 and the second sidewall portions 43 are removed. Such removal can be conducted by isotropic etching similar to the isotropic etching of FIG. 5 but will end with the resulting formation of second spacer fillets 50. As shown in FIG. 13, the second spacer fillets 50 include the gap filler portions 41 and remainders of the second bottom spacer portions 42 and the second sidewall portions 43. These remainders form a fillet portion having a curved upper surface 51 that runs substantially smoothly and continuously from the upper surfaces 210 of the bottom spacer remainders 25 to the sidewalls 120 of the bases of the fins 12.

Following the isotropic etching and the formation of the second spacer fillets 50, a bottom spacer assembly 60 (see FIG. 12) is formed between neighboring fins 12. The bottom spacer assembly 60 is thus provided as a dual bottom spacer including the bottom spacer remainders 25 and the second spacer fillets 50. In accordance with embodiments, the widths of each of the second spacer fillets 50 can be substantially similar whereas the widths of the bottom spacer remainders 25 can be variable. That is, differences in the spacing between neighboring fins 12 will be accounted for by the bottom spacer remainders 25 and not by the second spacer fillets 50. For example, as shown in FIG. 12, the central bottom spacer remainder is substantially wider than the laterally offset bottom spacer owing to the corresponding variations in the inter-group distances between the first and second groups of proximal fins and the intra-group distances between the proximal fins.

Figure 14:
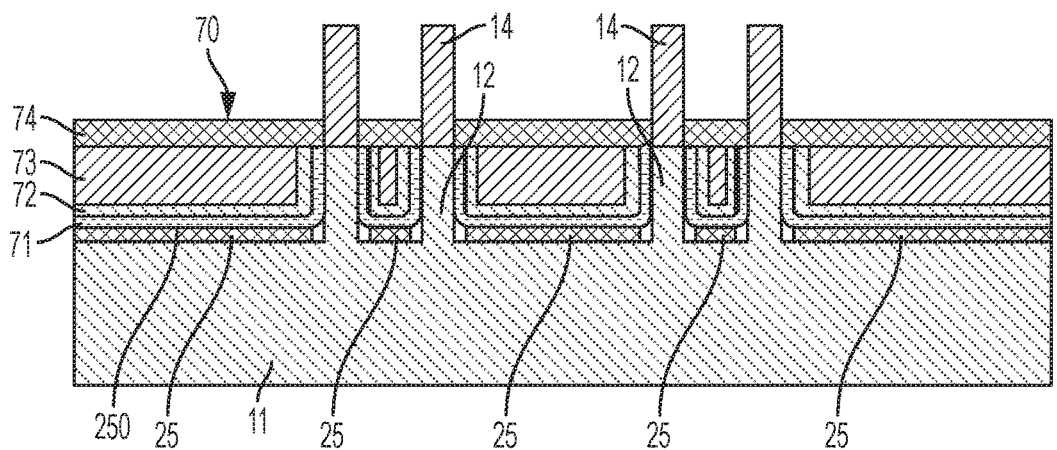

With reference to FIG. 14, a gate stack assembly 70 is formed over the bottom spacer remainders 25 and the second spacer fillets 50. The gate stack assembly 70 includes a gate dielectric layer 71, a work function metal layer 72, a gate electrode layer 73 and a top spacer layer 74. The gate dielectric layer 71 can be provided as a high-K dielectric, such as a hafnium based material like hafnium oxide, and has horizontal portions that run along the upper surfaces 250 of the bottom spacer remainders 25, vertical portions that run along the sidewalls 120 of the fins 12 and elbow portions that run along the curved upper surfaces 51 of the second spacer fillets 50. The work function metal layer 72 similarly includes horizontal portions, vertical portions and elbow portions. The gate electrode layer 73 can be formed of tungsten (W) or another similar metallic material and lies atop the work function metal layer 72. The top spacer layer 74 lies atop the gate electrode layer 73 and the respective terminal ends of the gate dielectric layer 71 and the work function metal layer 72.

Figure 15:
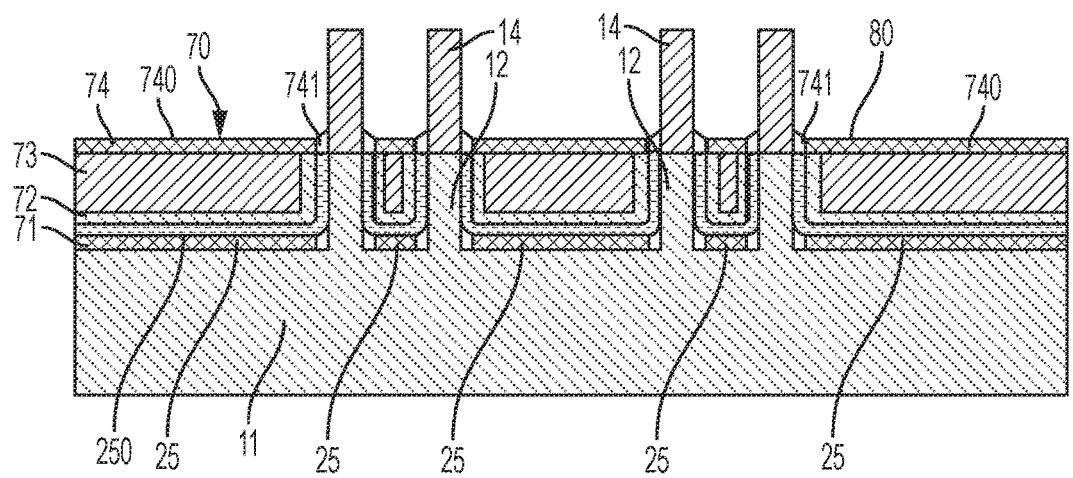

With reference to FIG. 15, the top spacer layer 74 that was laid down over the gate stack assembly 70 as described with reference to FIG. 14 is formed into top spacer layer remainders 740 and top spacer layer fillets 741. The process of such reformation of the top spacer 74 is similar to the processes described above and will not be re-described in detail. It will suffice to state that the reformation of the top spacer 74 will result in the formation of a top spacer assembly 80 on the gate stack assembly 70 and between neighboring fins 12. The top spacer assembly 80 is thus provided as a dual top spacer including the top spacer layer remainders 740 and the top spacer layer fillets 741. In accordance with embodiments, the widths of each of the top spacer layer fillets 741 can be substantially similar whereas the widths of the top spacer layer remainders 740 can be variable. That is, differences in the spacing between neighboring fins 12 will be accounted for by the top spacer layer remainders 740 and not by the top spacer layer fillets 741.

Figure 16:
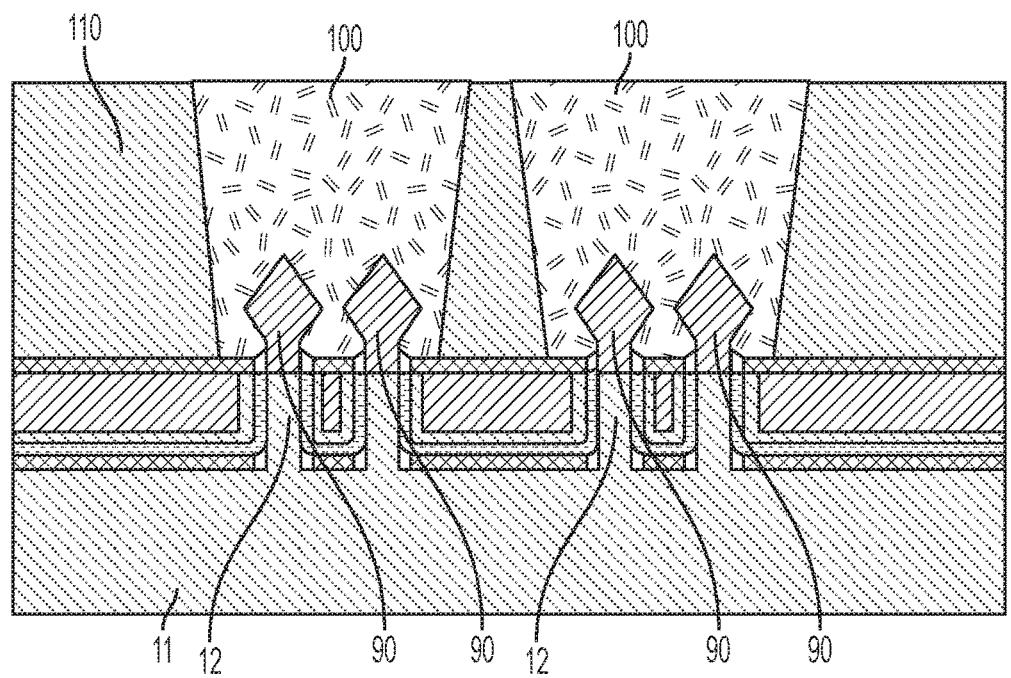
FIG. 16 is a side view of source/drain (S/D) contacts formed above a vertical field effect transistor (VFET) device.

At this point, with reference to FIG. 16, top source and drain contacts 90 are epitaxially grown at the upper surfaces of the fins 12, electrical contacts 100 are formed around the top source and drain contacts 90 and on proximal upper surfaces of the top spacer assembly 80 and inter-layer dielectric (ILD) 110 is deposited over remainders of the device and around the electrical contacts 100.

Epitaxial growth processes for the top source and drain contacts 90 include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature range for such epitaxial growth processes can be, for example, 550° C. to 900° C., but is not necessarily limited thereto, and the processes can be conducted at higher or lower temperatures as needed.

A number of different sources can be used for the epitaxial growth. For example, the sources can include precursor gas or gas mixtures including, for example, silicon containing precursor gas (such as silane) and/or a germanium containing precursor gas (such as a germane). Carrier gases like hydrogen, nitrogen, helium and argon can be used. The top source and drain contacts 99 can include a single crystalline semiconductor material. This single crystalline semiconductor material can be selected from, but is not limited to, silicon, a silicon germanium alloy, a silicon carbon alloy, a silicon germanium carbon alloy, a III-V compound semiconductor material, a II-VI compound semiconductor material, and an alloy or a combination thereof.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a spacer for a vertical transistor, the method comprising:
   forming a fin on a substrate;
   depositing a first spacer on the substrate to define gaps between the first spacer and the fin; and
   depositing a second spacer in at least the gaps,
   the second spacer being deposited as fillets in each of the gaps, each fillet comprising an uppermost surface increasing in height from an uppermost surface of the first spacer toward sidewalls of the fin.

2. The method according to claim 1, wherein the fin comprises a semiconductor fin on which a hard mask is disposed and the substrate comprises a semiconductor.

3. The method according to claim 1, wherein the depositing of the first spacer comprises conformal deposition processing.

4. The method according to claim 1, wherein the depositing of the second spacer comprises depositing the second spacer on exposed surfaces of the substrate in the gaps, on the fin and on the first spacer.

5. The method according to claim 4, further comprising:
   etching the second spacer to form the fillets;
   building a gate over the first spacer and the fillets and around the fin;
   forming a first spacer and second spacer fillets over a top spacer of the gate and around the fin; and
   forming top source/drain (S/D) contacts over the first spacer and the second spacer fillets.

6. A method of forming a spacer for a vertical transistor, the method comprising:
   forming a fin on a substrate;
   depositing a first spacer and an oxide on the fin such that uppermost portions of the first spacer are exposed through the oxide;
   etching portions of the first spacer to re-expose surfaces of the substrate adjacent to the fin via the openings to define gaps between remainders of the first spacer and the fin; and
   depositing a second spacer on the re-exposed surfaces of the substrate in at least the gaps,
   the second spacer being deposited as fillets in each of the gaps, each fillet comprising an uppermost surface increasing in height from an uppermost surface of the first spacer toward sidewalls of the fin.

7. The method according to claim 6, wherein the fin comprises a semiconductor fin on which a hard mask is disposed and the substrate comprises a semiconductor.

8. The method according to claim 6, wherein the depositing of the first spacer comprises conformal deposition processing.

9. The method according to claim 6, wherein the depositing of the oxide comprises:
depositing the oxide in a thick layer; and
chemical mechanical polishing of the thick layer to a plane of the uppermost portions of the first spacer.

10. The method according to claim 6, wherein the etching of the portions of the first spacer comprises sequential isotropic and un-isotropic etching.

11. The method according to claim 6, further comprising removing the oxide following the etching of the portions of the first spacer and prior to the depositing of the second spacer.

12. The method according to claim 6, wherein the depositing of the second spacer comprises depositing the second spacer on the re-exposed surfaces of the substrate in the gaps, on the fin and on the remainders of the first spacer.

13. The method according to claim 12, further comprising:
etching the second spacer to form the fillets;
building a gate over the remainders of the first spacer and the fillets and around the fin;
forming first spacer remainders and second spacer fillets over a top spacer of the gate and around the fin; and
forming top source/drain (S/D) contacts over the first spacer remainders and the second spacer fillets.

14. A method of forming a spacer for a vertical transistor, the method comprising:
forming multiple fins on a semiconductor substrate;
depositing a first spacer and an oxide on each of the multiple fins and on exposed surfaces of the semiconductor substrate between and around the multiple fins such that uppermost portions of the first spacer are exposed through openings in the oxide;
etching portions of the first spacer to re-expose surfaces of the substrate adjacent to each of the multiple fins via the openings to define gaps between remainders of the first spacer and corresponding ones of each of the multiple fins; and
depositing a second spacer on the re-exposed surfaces of the semiconductor substrate in at least the gaps,
the second spacer being deposited as fillets in each of the gaps, each fillet comprising an uppermost surface increasing in height from an uppermost surface of the first spacer toward sidewalls of corresponding ones of the multiple fins.

15. The method according to claim 14, wherein the depositing of the first spacer comprises conformal deposition processing.

16. The method according to claim 14, wherein the depositing of the oxide comprises:
depositing the oxide in a thick layer; and
chemical mechanical polishing of the thick layer to a plane of the uppermost portions of the first spacer.

17. The method according to claim 14, wherein the etching of the portions of the first spacer comprises sequential isotropic and un-isotropic etching.

18. The method according to claim 14, further comprising removing the oxide following the etching of the portions of the first spacer and prior to the depositing of the second spacer.

19. The method according to claim 14, wherein the depositing of the second spacer comprises depositing the second spacer on the re-exposed surfaces of the semiconductor substrate in the gaps, on the fins and on the remainders of the first spacer.

20. The method according to claim 19, further comprising:
etching the second spacer to form the fillets;
building a gate over the remainders of the first spacer and the fillets and around the fins;
forming first spacer remainders and second spacer fillets over a top spacer of the gate and around the fins; and
forming top source/drain (S/D) contacts over the first spacer remainders and the second spacer fillets.

* * * * *